(12) United States Patent
Xing

(10) Patent No.: US 11,011,585 B2
(45) Date of Patent: May 18, 2021

(54) DISPLAY PANEL AND DISPLAY DEVICE HAVING AN ARRAY OF SUB-PIXELS AND TRANSPARENT AREAS, AND DRIVING METHOD THEREOF

(71) Applicant: Shanghai Tianma Micro-Electronics Co., Ltd., Shanghai (CN)

(72) Inventor: Liang Xing, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 42 days.

(21) Appl. No.: 16/454,059

(22) Filed: Jun. 27, 2019

(65) Prior Publication Data

US 2019/0319079 A1    Oct. 17, 2019

(30) Foreign Application Priority Data

Oct. 24, 2018   (CN) .......................... 201811244348.X

(51) Int. Cl.
*H01L 27/32* (2006.01)
*H01L 27/15* (2006.01)
(Continued)

(52) U.S. Cl.
CPC ....... *H01L 27/3213* (2013.01); *G09G 3/2003* (2013.01); *G09G 3/2074* (2013.01);
(Continued)

(58) Field of Classification Search
CPC ............... H01L 27/3213; H01L 27/156; H01L 27/3218; H01L 27/3216
See application file for complete search history.

(56) References Cited

U.S. PATENT DOCUMENTS 8,810,607 B2 * 8/2014 van Veenendaal .......................... G02F 1/133305
345/690
8,952,374 B2 * 2/2015 Jinta ................... H01L 27/3216
257/40
(Continued)

FOREIGN PATENT DOCUMENTS

CN          1187083 A      7/1998
CN        105261325 A      1/2016
(Continued)

*Primary Examiner* — Ida M Soward
(74) *Attorney, Agent, or Firm* — Kilpatrick Townsend & Stockton, LLP

(57) ABSTRACT

The present disclosure provides a display panel including pixel areas arranged in array. The pixel area includes a sub-pixel area and a transparent area arranged in column direction. For two adjacent rows of pixel areas, sub-pixel areas/transparent areas of pixel areas in one row are disposed adjacent to sub-pixel areas/transparent areas of pixel areas in the other row. The sub-pixel area in an odd-numbered row of pixel areas is first sub-pixel area, in which first and second sub-pixels are arranged along row direction. The sub-pixel area in an even-numbered row of pixel areas is second sub-pixel area, in which third and fourth sub-pixels are arranged along row direction. First and third sub-pixels are arranged along column direction, and second and fourth sub-pixels are arranged along column direction. First, second and fourth sub-pixels emit light of different colors, and second and third sub-pixels emit light of a same color.

19 Claims, 11 Drawing Sheets

(51) Int. Cl.
*G09G 3/3225* (2016.01)
*G09G 3/20* (2006.01)
*G09G 3/32* (2016.01)
*G09G 3/3266* (2016.01)

(52) U.S. Cl.
CPC ............. *G09G 3/32* (2013.01); *G09G 3/3225*
(2013.01); *G09G 3/3266* (2013.01); *H01L*
*27/156* (2013.01); *G09G 2300/0452* (2013.01);
*G09G 2310/0213* (2013.01); *G09G 2340/0407*
(2013.01); *H01L 27/3216* (2013.01); *H01L*
*27/3218* (2013.01); *H01L 27/3244* (2013.01)

(56) References Cited

U.S. PATENT DOCUMENTS

| | | | | |
|---|---|---|---|---|
| 9,117,402 | B2* | 8/2015 | Lee | H01L 27/3279 |
| 9,190,457 | B2* | 11/2015 | Im | H01L 27/3246 |
| 9,224,334 | B2* | 12/2015 | Izumi | G09G 3/2003 |
| 9,311,853 | B2* | 4/2016 | Minami | H01L 27/3265 |
| 10,297,645 | B2* | 5/2019 | Wacyk | H01L 51/56 |
| 10,714,001 | B2* | 7/2020 | Cok | H01L 27/3276 |
| 10,840,306 | B2* | 11/2020 | Kim | H01L 27/3216 |
| 2008/0205792 | A1* | 8/2008 | Andersen | H04N 9/04515 |
| | | | | 382/299 |
| 2011/0220921 | A1* | 9/2011 | Tamura | H01L 27/3218 |
| | | | | 257/88 |
| 2012/0080680 | A1 | 4/2012 | Choi et al. | |
| 2013/0285537 | A1* | 10/2013 | Chaji | H01L 27/322 |
| | | | | 313/504 |
| 2014/0111115 | A1* | 4/2014 | Bai | G02F 1/13439 |
| | | | | 315/312 |
| 2015/0287767 | A1* | 10/2015 | Lee | H01L 51/5206 |
| | | | | 257/40 |
| 2016/0104413 | A1* | 4/2016 | Matsueda | H01L 27/3218 |
| | | | | 345/694 |
| 2016/0155780 | A1* | 6/2016 | Shin | H01L 27/3218 |
| | | | | 257/40 |
| 2016/0163770 | A1* | 6/2016 | Kim | H01L 27/3218 |
| | | | | 257/40 |
| 2016/0276396 | A1* | 9/2016 | Tayanaka | H01L 27/14645 |
| 2018/0182827 | A1* | 6/2018 | Kim | H01L 27/3258 |
| 2019/0154893 | A1* | 5/2019 | Kobashi | G02F 1/133514 |

FOREIGN PATENT DOCUMENTS

| | | |
|---|---|---|
| CN | 106205386 A | 12/2016 |
| CN | 206194742 U | 5/2017 |
| CN | 207338380 U | 5/2018 |
| KR | 100900061 B1 | 5/2009 |

* cited by examiner

US 11,011,585 B2

DISPLAY PANEL AND DISPLAY DEVICE HAVING AN ARRAY OF SUB-PIXELS AND TRANSPARENT AREAS, AND DRIVING METHOD THEREOF

CROSS-REFERENCE TO RELATED APPLICATIONS

The present application claims priority to Chinese Patent Application No. 201811244348.X, filed on Oct. 24, 2018, the content of which is incorporated herein by reference in its entirety.

FIELD

The present disclosure relates to the field of display technologies, and in particular, to a display panel, a driving method thereof, and a display device.

BACKGROUND

With the development of display technologies, a new type of transparent display device has attracted the public's attention. Herein, the transparent display device means that the display device itself has a certain degree of light transmittance, and the viewer can not only see an image displayed by the display device but also see a view behind the display device. However, light transmittance of the existing transparent display device, i.e., light transmittance of background light is still low, and cannot satisfy the demand of people for viewing the view behind the device.

SUMMARY

The present disclosure provides a display panel, a driving method thereof, and a display device, to solve the problem of low transmittance of a conventional transparent display device.

In one embodiment, the present disclosure provides a display panel, including: pixel areas arranged in an array and sub-pixels located in pixel areas. Each of pixel areas includes a sub-pixel area and a transparent area that are arranged in a column direction. For two adjacent rows of pixel areas of pixel areas, sub-pixel areas of pixel areas in one row of pixel areas are disposed adjacent to sub-pixel areas of pixel areas in the other row of pixel areas, or transparent areas of pixel areas in one row of pixel areas are disposed adjacent to transparent areas of pixel areas in the other row of pixel areas. Sub-pixels includes a first sub-pixel, a second sub-pixel, a third sub-pixel and a fourth sub-pixel. The sub-pixel area of each pixel area in an odd-numbered row of pixel areas of pixel areas is a first sub-pixel area, and the first sub-pixel and the second sub-pixel are arranged in the first sub-pixel area along a row direction. The sub-pixel area of each pixel area in an even-numbered row of pixel areas of pixel areas is a second sub-pixel area, and the third sub-pixel and the fourth sub-pixel are arranged in the second sub-pixel area along the row direction. The first sub-pixel and the third sub-pixel are arranged along the column direction, and the second sub-pixel and the fourth sub-pixel are arranged along the column direction. The first sub-pixel, the second sub-pixel, and the fourth sub-pixel emit light of different colors, and the second sub-pixel and the third sub-pixel emit light of a same color.

In one embodiment, the present disclosure provides a driving method applied to the abovementioned display panel. The display panel includes at least a first driving mode, and each frame of scan time in the first driving mode includes a first scan period and a second scan period. The driving method includes: during the first scan period, sequentially providing a scan signal to sub-pixels in pixel areas, and providing a data signal to the first sub-pixel, the third sub-pixel, and the fourth sub-pixel, respectively; and during the second scan period, sequentially providing a scan signal to sub-pixels in pixel areas, and providing a data signal to the first sub-pixel, the second sub-pixel, and the fourth sub-pixel, respectively.

In one embodiment, the present disclosure provides a display device including the abovementioned display panel.

BRIEF DESCRIPTION OF DRAWINGS

Embodiments of the present disclosure are illustrated by the accompanying drawings.

DESCRIPTION OF EMBODIMENTS

Embodiments of the present disclosure are described in the following with reference to the accompanying drawings in the embodiments of the present disclosure. It should be noted that the described embodiments are merely exemplary embodiments of the present disclosure, which shall not be interpreted as limiting the present disclosure.

Figure 1:
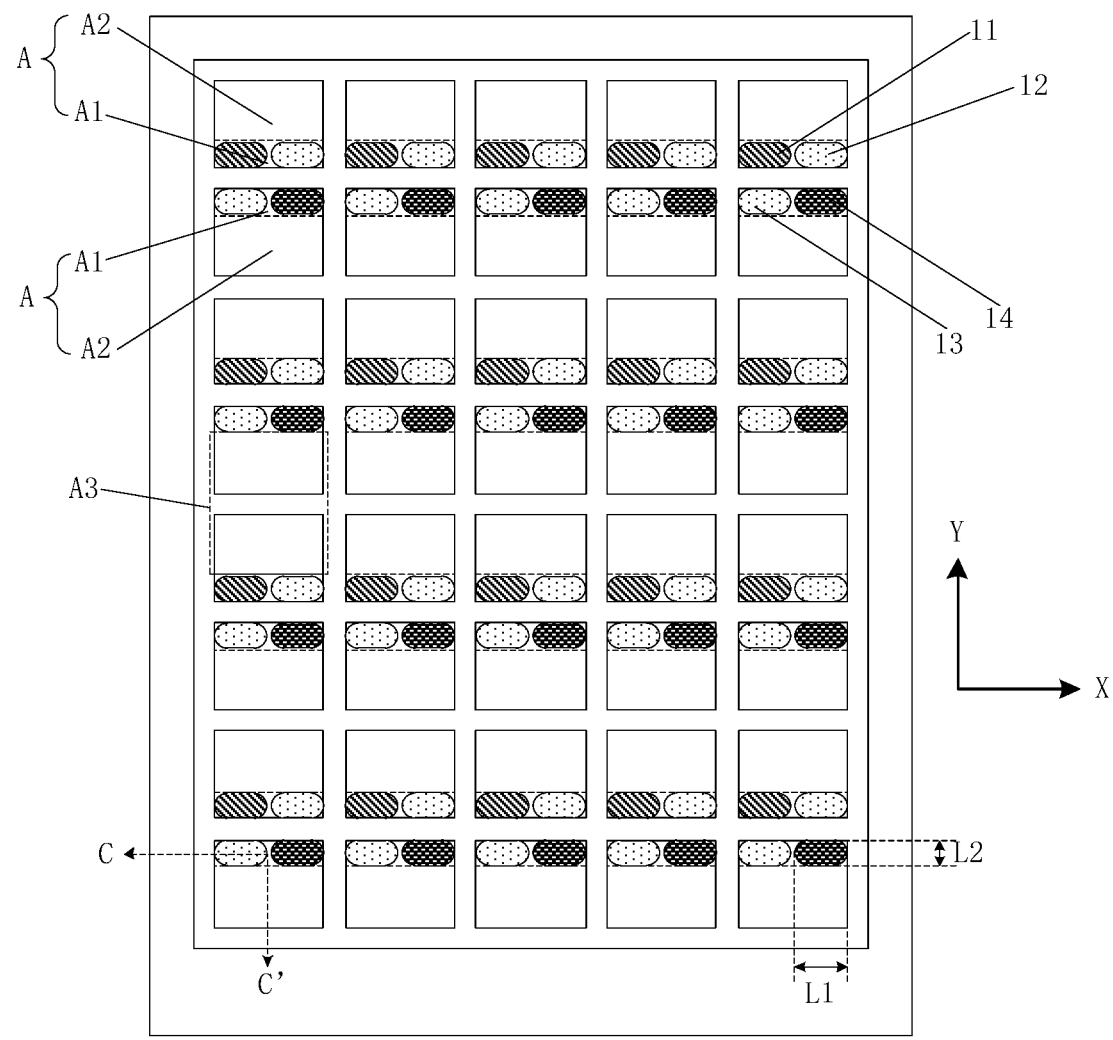
FIG. 1 is a schematic top view of a structure of a display panel according to an embodiment of the present disclosure.

An embodiment of the present disclosure provides a display panel. FIG. 1 is a schematic top view of a structure of a display panel according to an embodiment of the present disclosure. As shown in FIG. 1, the display panel includes a display area and a non-display area surrounding the display area. The display area further includes pixel areas A, and pixel areas A is arranged in an array in a row direction X and a column direction Y.

Each of pixel areas A further includes a sub-pixel area A1 and a transparent area A2 that are arranged in the column direction Y. Herein, the sub-pixel area A1 refers to an area in which sub-pixels are arranged, and the transparent area A2 refers to an area in which no sub-pixel or any other component is arranged. It should be noted that although no sub-pixel or any other component is arranged in the transparent area A2, a film layer such as an insulation layer is arranged therein so as to achieve flatness of the entire display panel. However, since such film layer is light transmissive, it would not affect transparency of the transparent area A2.

Figure 2:
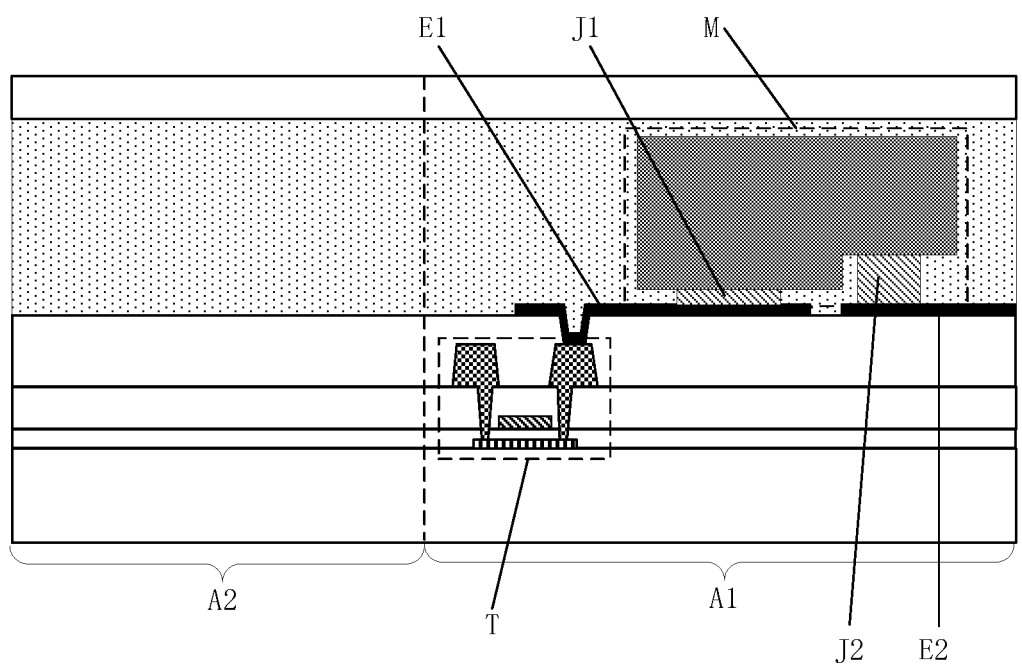
FIG. 2 is a cross-sectional view along line CC' of the structure of the display panel shown in FIG. 1.

FIG. 2 is a cross-sectional view along line CC' of the structure of the display panel shown in FIG. 1. As shown in FIG. 2, a sub-pixel is arranged in the sub-pixel area A1, and the sub-pixel includes a thin film transistor T and a micro light-emitting diode M. The thin film transistor T has a gate electrode electrically connected to a scan line, a source electrode electrically connected to a data line, and a drain electrode electrically connected to an anode J1 of the micro light-emitting diode M through a pixel electrode E1. After a scan signal is inputted to the gate electrode of the thin film transistor T via the scan line, the thin film transistor T is turned on, and a data signal is inputted to the micro light-emitting diode M via the data line through the turned-on thin film transistor T and the pixel electrode E1 so as to drive the micro light-emitting diode M to emit light. A cathode J2 of the micro light-emitting diode M is electrically connected to a common electrode E2. Herein, the common electrode E2 is a grid-like electrode having hollow areas. The pixel electrode E1 is arranged in the hollow area, and the non-hollow area is electrically connected to the cathode J2. It should be noted that, it is merely an example in FIG. 2 that the sub-pixel includes the micro light-emitting diode, but the present disclosure is not limited thereto.

Figure 3:
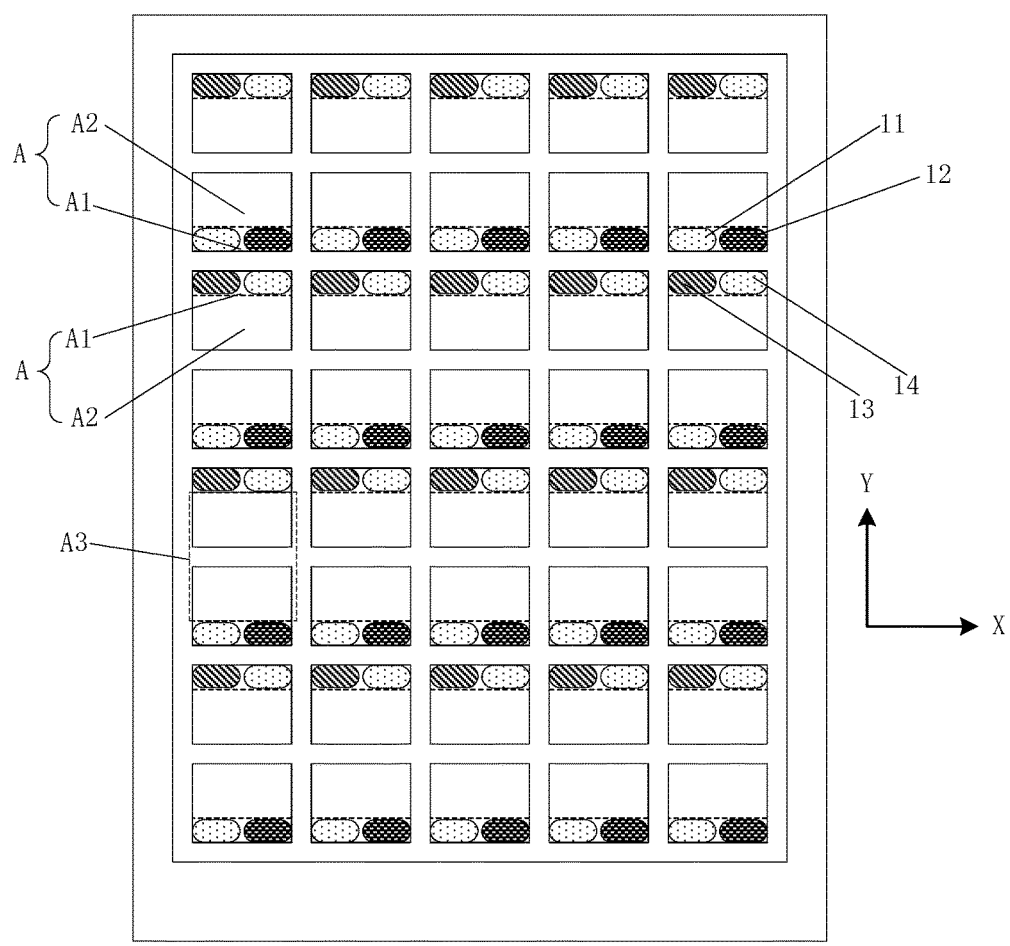
FIG. 3 is a schematic top view of a structure of another display panel according to an embodiment of the present disclosure.

In this embodiment of the present disclosure, sub-pixel areas A1 of pixel areas A in a row of the array are disposed adjacent to sub-pixel areas A1 of pixel areas A in an adjacent row of the array, or transparent areas A2 of pixel areas A in a row of the array are disposed adjacent to transparent areas A2 of pixel areas A in an adjacent row of the array. As shown in FIG. 1, sub-pixel areas A1 of pixel areas A in a first row of the array are disposed adjacent to sub-pixel areas A1 of pixel areas A in a second row of the array, and transparent areas A2 of pixel areas A in a third row of the array are disposed adjacent to transparent areas A2 of pixel areas A in the second row of the array, and so on. In one embodiment, as shown in FIG. 3, which is a schematic top view of a structure of another display panel according to an embodiment of the present disclosure, transparent areas A2 of pixel areas A in a first row of the array is disposed adjacent to transparent areas A2 of pixel areas A in a second row of the array, and sub-pixel areas A1 of pixel areas A in the second row of the array is disposed adjacent to sub-pixel areas A1 of pixel areas A in a third row of the array, and so on.

In other words, in addition to pixel areas A in the first row and the last row of the array, sub-pixel areas A1 of pixel areas A in any row of the array are disposed adjacent to sub-pixel areas A1 of pixel areas A in an adjacent row of the array, and transparent areas A2 of pixel areas A in any row of the array are disposed adjacent to transparent areas A2 of pixel areas in an adjacent row of the array. It should be noted in this embodiment of the present disclosure, sub-pixel areas A1 of pixel areas A in a row of the array being disposed adjacent to sub-pixel areas A1 of pixel areas A in an adjacent row of the array means that no transparent area A2 is disposed between the two adjacent sub-pixel areas A1, and transparent areas A2 of pixel areas A in a row of the array being disposed adjacent to transparent areas A2 of pixel areas A in an adjacent row of the array means that no sub-pixel area A1 is disposed between the two adjacent transparent areas A2.

In this embodiment of the present disclosure, as shown in FIG. 1 and FIG. 2, transparent areas A2 of pixel areas A in a row of the array are disposed adjacent to transparent areas A2 of pixel areas A in an adjacent row of the array, so that a transparent area A3 having a larger area is formed. In this way, the transparent areas account for a larger proportion of the entire display panel, so that the transparency or light transmittance of the display panel can be increased. Moreover, sub-pixel areas A1 of pixel areas A in a row of the array are disposed adjacent to sub-pixel areas A1 of pixel areas A in an adjacent row of the array, so that no transparent area A3 is disposed between sub-pixels of a same pixel. In this way, a spacing between sub-pixels of a same pixel can be reduced, which is more advantageous for mixing light of different sub-pixels of a same pixel. In one embodiment, no transparent area A3 is disposed among the first sub-pixel 11, the third sub-pixel 13, and the fourth sub-pixel 14 of a same pixel, so that a spacing between the first sub-pixel 11 and the third sub-pixel 13 is smaller, which is more advantageous for mixing red light, green light and blue light respectively emitted by the first sub-pixel 11, the third sub-pixel 13 and the fourth sub-pixel 14, so as to form white light required for image display.

In this embodiment of the present disclosure, each sub-pixel area A1 is provided with two sub-pixels. As shown in FIG. 1 and FIG. 2, a sub-pixel area A1 of a pixel area A in each odd-numbered row is a first sub-pixel area, and a first sub-pixel 11 and a second sub-pixel 12 are arranged in the first sub-pixel area along the row direction X; a sub-pixel area A1 of a pixel area A in each even-numbered row is a second sub-pixel area, and a third sub-pixel 13 and a fourth sub-pixel 14 are arranged in the second sub-pixel area along the row direction X.

Each sub-pixel area A1 is provided with only two sub-pixels, that is, each pixel area A is provided with only two sub-pixels. In this case, when the pixel area A has a certain area, compared with a case where each pixel area A is provided with three sub-pixels, this embodiment of the present disclosure can further increase an area of the transparent area A2 and increase the transparency or light transmittance of the display panel.

The first sub-pixel 11 and the third sub-pixel 13 are sequentially arranged along the column direction Y, and the second sub-pixel 12 and the fourth sub-pixel 14 are sequentially arranged along the column direction Y. That is, the first sub-pixel 11 and the second sub-pixel 12 are located in a same row, the third sub-pixel 13 and the fourth sub-pixel 14 are located in a same row, the first sub-pixel 11 and the third sub-pixel 13 are located in a same column, and the second sub-pixel 12 and the fourth sub-pixel 14 are located in a same column.

Further, the second sub-pixel 12 and the third sub-pixel 13 emit light of a same color, while the first sub-pixel 11, the second sub-pixel 12, and the fourth sub-pixel 14 emit light of different colors from one another. In one embodiment, the second sub-pixel 12 and the third sub-pixel 13 emit green light, while the first sub-pixel 11, the second sub-pixel 12, and the fourth sub-pixel 14 respectively emit red light, green light, and blue light.

Based on the abovementioned arrangement of the sub-pixels, in this embodiment of the present disclosure, the display panel can be driven by using a time-division driving method. In one embodiment, in a first driving mode, one frame of scan time includes a first scan period and a second scan period. The first sub-pixel 11, the third sub-pixel 13 and the fourth sub-pixel 14 are driven during the first scan period, and the first sub-pixel 11, the second sub-pixel 12 and the fourth sub-pixel 14 are driven during the second scan period, so as to perform displaying. It should be noted that the display panel can also be driven without using a time-division driving method. In one embodiment, in a second driving mode, the first sub-pixel 11, the second sub-pixel 12, the third sub-pixel 13, and the fourth sub-pixel 14 are driven during one frame of scan time to perform displaying. The driving method for the display panel provided by the embodiments of the present disclosure will be described in following embodiments.

Since the first sub-pixel 11, the third sub-pixel 13, and the fourth sub-pixel 14 are sub-pixels emitting light of different colors, and the first sub-pixel 11, the second sub-pixel 12, and the fourth sub-pixel 14 are sub-pixels emitting light of different colors, such as sub-pixels emitting red light, green light and blue light, the display panel can display images respectively during the first scan period and during the second scan period, and an image having a high resolution can be formed after the images displayed during the two periods are superimposed. In this way, the transparency or transmittance of the display panel can be increased, and the resolution of the display panel can be increased.

In one embodiment, when displaying an image, only the first sub-pixel 11, the third sub-pixel 13 and the fourth sub-pixel 14 perform displaying while the second sub-pixel 12 does not perform displaying during the first scan period, and the first sub-pixel 11, the third sub-pixel 13 and the fourth sub-pixel 14 together form an L-shaped first pixel; and the first sub-pixel 11, the second sub-pixel 12, and the fourth sub-pixel 14 perform displaying while the third sub-pixel 13 does not perform displaying during the second scan period, and the first sub-pixel 11, the second sub-pixel 12 and the fourth sub-pixel 14 together form an L-shaped second pixel. When an image corresponding to the first scan period is superimposed with an image corresponding to the second scan period, since the two L-shaped pixels do not completely overlap with each other, that is, there are an overlapping area and a non-overlapping area in the row direction X, the human eye can spatially distinguish the two L-shaped pixels. That is, the two L-shaped pixels can be viewed as two pixel points arranged in the row direction X in the superimposed image. In this case, the resolution of the display panel in the row direction X can be increased by using pixel rendering, which can increase the overall resolution of the display panel.

Furthermore, the second sub-pixel 12 does not perform displaying during the first scan period, and the third sub-pixel 13 does not perform displaying during the second scan period. Therefore, during the first scan period or the second scan period, a sub-pixel not performing displaying is disposed between two adjacent pixels, so that division between adjacent pixels is more pronounced. In this case, each sub-pixels forming the pixel can have a better color mixing, thereby allowing the image to be displayed be clearer.

In an embodiment, the first sub-pixel 11 is a red sub-pixel, the second sub-pixel 12 and the third sub-pixel 13 are green sub-pixels, and the fourth sub-pixel 14 is a blue sub-pixel.

A brightness ratio of the red sub-pixel, the green sub-pixel, and the blue sub-pixel is 3:6:1, and light formed by mixing light emitted from these sub-pixels is white light. Therefore, in this embodiment of the present disclosure, In one embodiment, in the second driving mode, each of two green sub-pixels can have a reduced brightness by controlling the two green sub-pixels to simultaneously emit light. In this way, a driving voltage or a driving current of the green sub-pixel can be reduced, thereby reducing the power consumption of the display panel.

Furthermore, the green sub-pixel has a low luminous efficiency, that is, the green sub-pixel has a short service life. Therefore, in the first driving mode, two green sub-pixels (i.e., the second sub-pixel 12 and the third sub-pixel 13) are controlled to emit light during two scan periods, such that a luminous duration of each green sub-pixel during one frame of scan time can be reduced. In this way, each green sub-pixel, i.e., the second sub-pixel 12 or the third sub-pixel 13, can have a relatively extended service life.

It should be noted that the present disclosure is not limited thereto. Further, in another embodiment, the first sub-pixel 11 is a blue sub-pixel, the second sub-pixel 12 and the third sub-pixel 13 are red sub-pixels, and the fourth sub-pixel 14 is a green sub-pixel. In still another embodiment, the first sub-pixel 11 is a green sub-pixel, the second sub-pixel 12 and the third sub-pixel 13 are blue sub-pixels, and the fourth sub-pixel 14 is a blue sub-pixel.

In an embodiment, the sub-pixel includes a micro light-emitting diode (Micro-LED). The red sub-pixel includes a micro light-emitting diode that emits red light, the green sub-pixel includes a micro light-emitting diode that emits green light, and the blue sub-pixel includes a micro light-emitting diode that emits blue light. It should be noted that the present disclosure is not limited thereto. In other embodiments, the sub-pixel may further include a light-emitting diode or an organic light-emitting diode or the like.

Since the micro light-emitting diode has a small volume, the transparent area A2 can have a further increased area, thereby increasing the transparency or light transmittance of the display panel. Since the micro light-emitting diode has a low manufacturing yield, one or more spare micro light-emitting diodes are usually arranged in a same sub-pixel area A1 to improve the yield of the display panel. However, since only two sub-pixels are arranged in each sub-pixel area A1 in this embodiment of the present disclosure, the number of spare micro light-emitting diodes in each sub-pixel area A1 can be reduced, so that the transparency or light transmittance of the panel can be achieved while ensuring the yield of the display panel.

It should be noted that in this embodiment of the present disclosure, the micro light-emitting diode may be a normal-type, flip-type, or vertically-encapsulated micro light-emitting diode, and details thereof will not be described herein. Moreover, the micro light-emitting diode can be formed on a substrate of the display panel by means of transport, or can be directly formed on the substrate of the display panel, which will not be limited by the present disclosure.

In an embodiment, as shown in FIG. 1, the sub-pixel has a length L1 in the row direction X and a length L2 in the column direction Y, and the length L1 is greater than the length L2. When the pixel area A has a certain area, compared with an arrangement manner in which a long side of the sub-pixel extends in the column direction Y, a spacing between two sub-pixels in the row direction X can be reduced in this embodiment of the present disclosure by making the long side of the sub-pixel extend in the row direction X. In this way, the area of the sub-pixel area A1 can be fully utilized, the area of the transparent area A2 can be further increased, the transparency or light transmittance of the display panel can be increased, and light mixing between sub-pixels of a same pixel can be improved.

It should be noted that the present disclosure is not limited thereto. In other embodiments, if there is no big difference between the long side and the short side of the sub-pixel, the long side of the sub-pixel may extend in the column direction Y. That is, in other embodiments, the length L1 of the sub-pixel in the row direction X may be smaller than the length L2 in the column direction Y.

It should be noted that, it is merely an example in this embodiment of the present disclosure that the sub-pixel is shaped as a long-bar structure, and the present disclosure is not limited thereto. In other embodiments, the sub-pixel may also be shaped as a rectangle, a circle, a polygon, etc.

Figure 4:
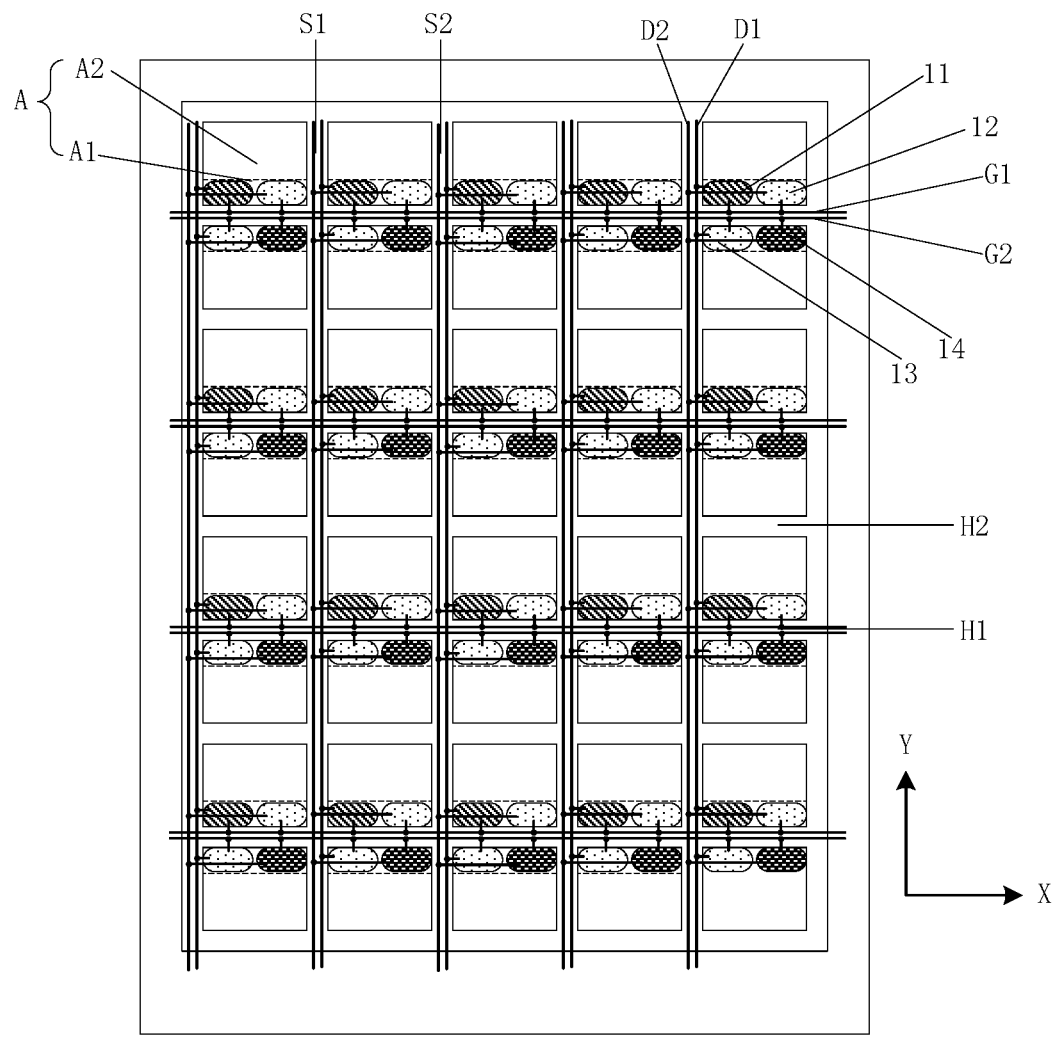
FIG. 4 is a schematic top view of another structure of a display panel according to an embodiment of the present disclosure.
Figure 5:
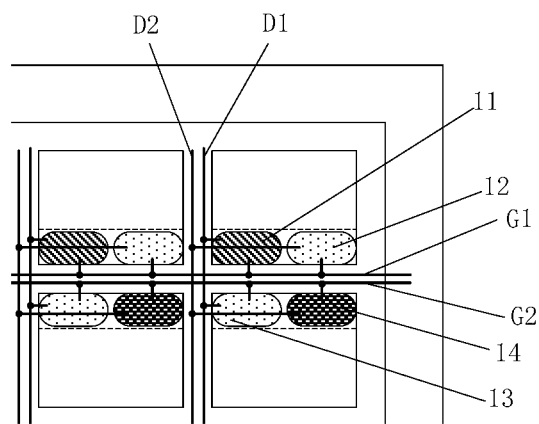
FIG. 5 is a partial enlarged view of the structure shown in FIG. 4.

The display panel in this embodiment of the present disclosure further includes scan lines and data lines arranged in the display area, and gate driving circuits, data driving circuits and the like arranged in the non-display area. FIG. 4 is a schematic top view of another structure of a display panel according to an embodiment of the present disclosure, and FIG. 5 is a partial enlarged view of the structure shown in FIG. 4. In an embodiment, as shown in FIG. 4 and FIG. 5, among pixel areas A arranged in an array, there are column spacings extending in the column direction Y. The column spacings include a first column spacing S1 and a second column spacing S2 that are respectively located at opposite sides of a pixel area A. The first column spacing S1 is disposed adjacent to the first sub-pixel 11, and the second column spacing S2 is disposed adjacent to the second sub-pixel 12. The data lines connected to sub-pixels in each pixel area A are arranged in the column spacing S1 and/or S2.

In this embodiment of the present disclosure, the data lines of the sub-pixels in a same pixel area A are arranged in the column spacing S1 or S2, In one embodiment, the data lines of the sub-pixels in a same pixel area A are arranged in the column spacing S1 located on one side of the pixel area A, or the data lines of the sub-pixels in a same pixel area A are arranged in the column spacing S1 and the column spacing S2 located respectively on two sides of the pixel area A. In this way, the data line does not overlap with the transparent area A2, and thus it will not affect the transparency or light transmittance of the transparent area A2.

In an embodiment, as shown in FIG. 4, a data line D1 connected to the first sub-pixel 11 and the third sub-pixel 13 is located in the first column spacing S1, and a data line D2 connected to the second sub-pixel 12 and the fourth sub-pixel 14 is also located in the first column spacing S1, that is, the data line D1 and the data line D2 are both located in the column spacing located at a left side of the pixel area A where the sub-pixels are located. In one embodiment, the data line D1 connected to the first sub-pixel 11 and the third sub-pixel 13 is located in the second column spacing S2, and the data line D2 connected to the second sub-pixel 12 and the fourth sub-pixel 14 is also located in the second column spacing S2, that is, the data line D1 and the data line D2 are both located in the column spacing located at a right side of the pixel area A where the sub-pixels are located.

Figure 6:
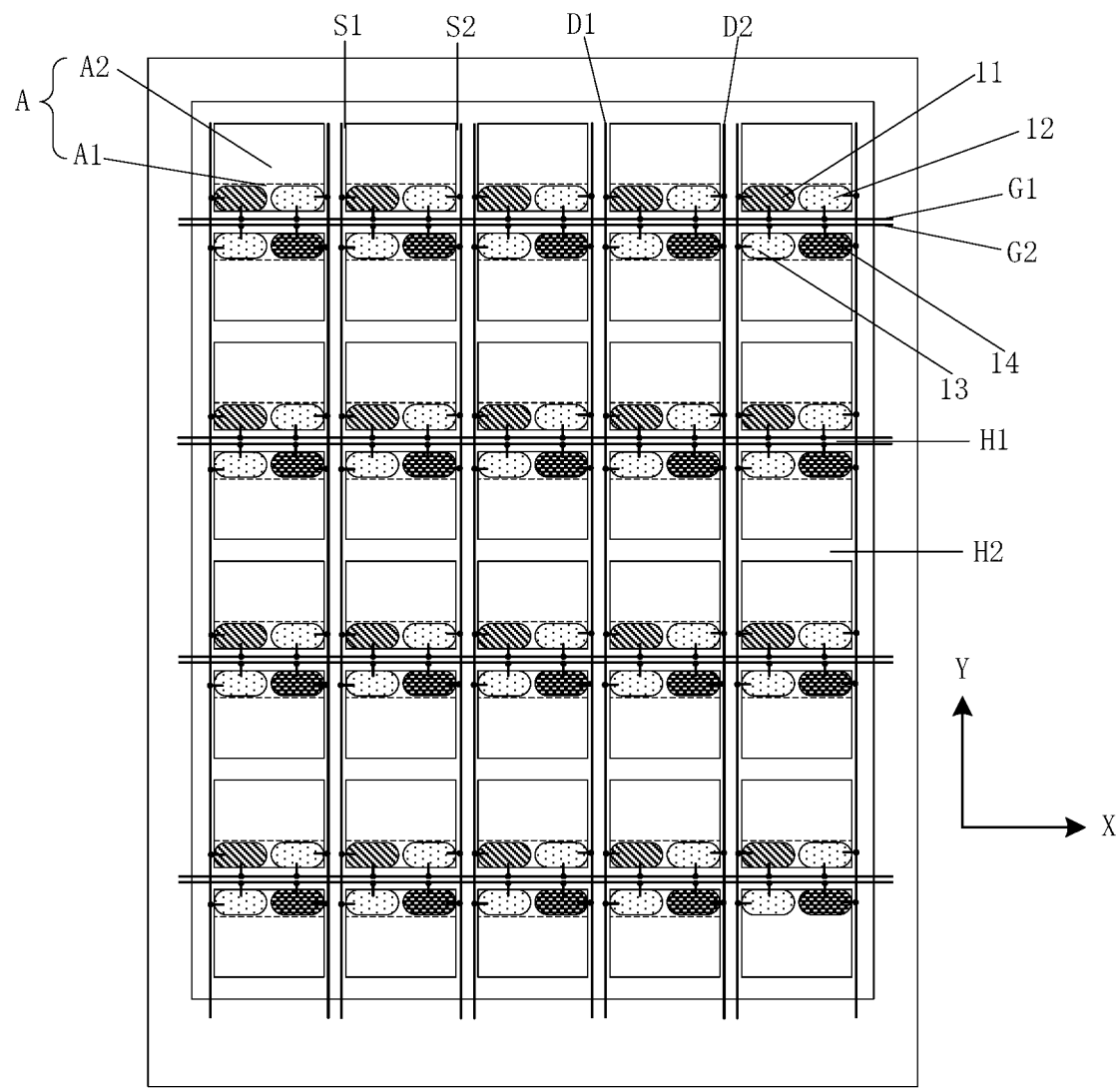
FIG. 6 is a schematic top view of still another structure of a display panel according to an embodiment of the present disclosure.

FIG. 6 is a schematic top view of still another structure of a display panel according to an embodiment of the present disclosure. In an embodiment, as shown in FIG. 6, the data line D1 connected to the first sub-pixel 11 and the third sub-pixel 13 is located in the first column spacing S1, and the data line D2 connected to the second sub-pixel 12 and the fourth sub-pixel 14 is located in the second column spacing S2. In this way, a distance between the data line and the sub-pixel connected to the data line can be reduced, which further facilitates the application.

Furthermore, as shown in FIG. 4 and FIG. 6, among pixel areas A arranged in an array, there are row spacings extending in the row direction X. The row spacings include a first row spacing H1 and a second row spacing H2. Sub-pixel areas A1 are located respectively on two sides of the first row spacing H1, and transparent areas A2 are located respectively on two sides of the second row spacing H2. In an embodiment, sub-pixels in each pixel area A are connected to a corresponding scan line located in the first row spacing H1.

The scan lines include a first scan line G1 and a second scan line G2. The first scan line G1 is connected to the sub-pixels in the sub-pixel area A1 located on one side of the first row spacing H1. In one embodiment, the first scan line G1 is arranged to be close to the first sub-pixel 11 and the second sub-pixel 12, and is connected to the first sub-pixel 11 and the second sub-pixel 12. The second scan line G2 is connected to the sub-pixels in the sub-pixel area A1 located on the other side of the first row spacing H1. In one embodiment, the second scan line G2 is arranged to be close to the third sub-pixel 13 and the fourth sub-pixel 14, and is connected to the third sub-pixel 13 and the fourth sub-pixel 14.

In this embodiment of the present disclosure, the scan line connected to the sub-pixels in the pixel area A is arranged in the first row spacing H1, In one embodiment, the first scan line G1 connected to the first sub-pixel 11 and the second sub-pixel 12 is arranged in the first row spacing H1, and the second scan line G2 connected to the third sub-pixel 13 and the fourth sub-pixel 14 is also arranged in the first row spacing H1. In this way, the scan line does not overlap with the transparent area A3, and thus it will not affect the transparency or light transmittance of entire display panel.

Figure 7:
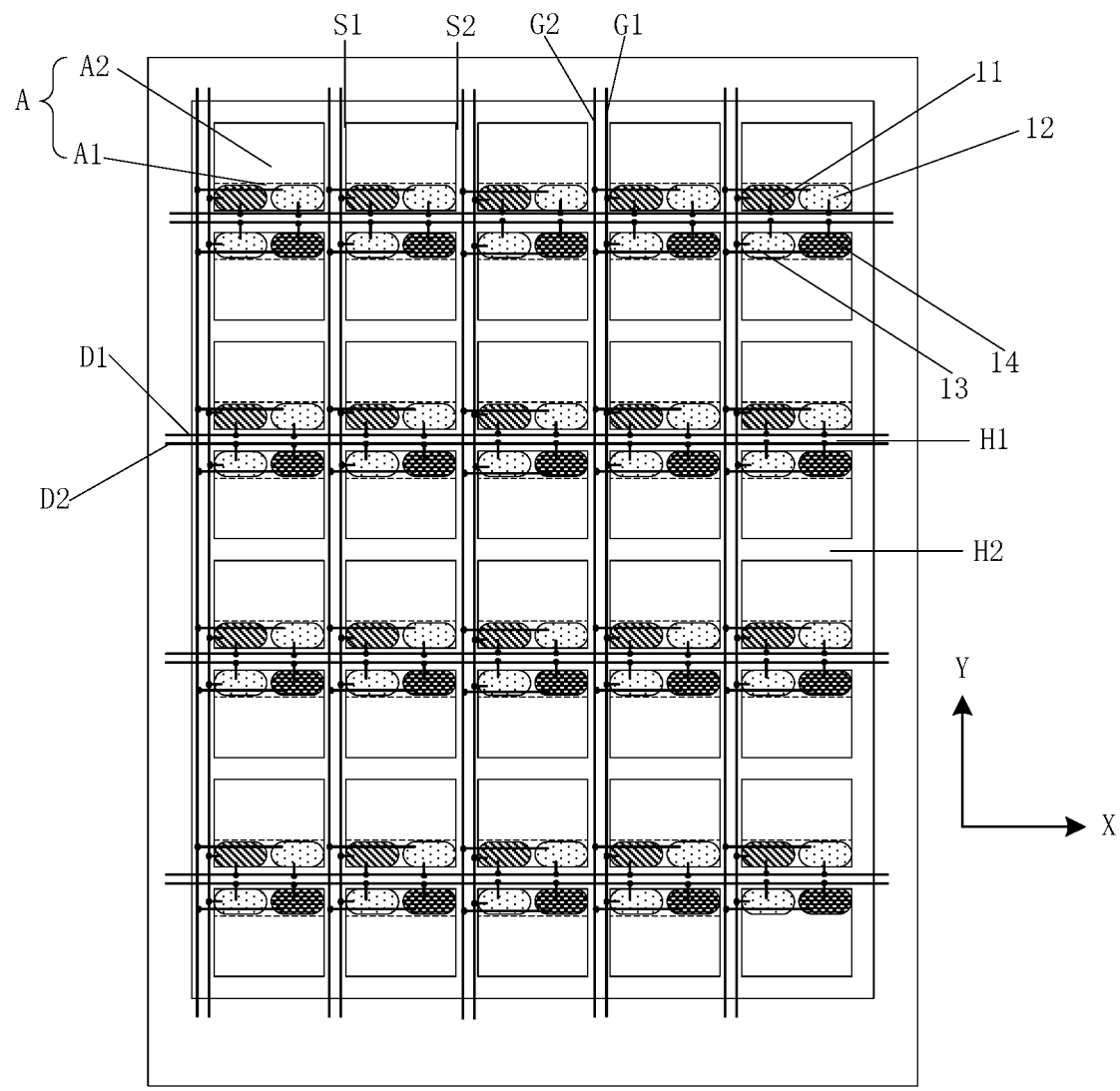
FIG. 7 is a schematic top view of a structure of still another display panel according to an embodiment of the present disclosure.

FIG. 7 is a schematic top view of a structure of still another display panel according to an embodiment of the present disclosure. In an embodiment, as shown in FIG. 7, there are row spacings extending in the row direction X among pixel areas A arranged in an array. The row spacings include a first row spacing H1 and a second row spacing H2. Sub-pixel areas A1 are located respectively on two sides of the first row spacing H1, and transparent areas A2 are located respectively on two sides of the second row spacing H2. In this embodiment, the sub-pixels in each pixel area A are connected to a respective data line located in the first row spacing H1.

In this embodiment, sub-pixels in each pixel area A are connected to a respective data line located in the first row spacing H1, In one embodiment, the first data line D1 connected to the first sub-pixel 11 and the second sub-pixel 12 is arranged in the first row spacing H1, and the second data line D2 connected to the third sub-pixel 13 and the fourth sub-pixel 14 is also arranged in the first row spacing H1. In this way, the data line does not overlap with the transparent area A3, and thus it will not affect the transparency or light transmittance of entire display panel. Moreover, there are column spacings extending in the column direction Y among pixel areas A arranged in an array, and scan lines connected to the sub-pixels in the pixel areas A are located in the column spacings. The column spacings include a first column spacing S1 and a second column spacing S2 that are respectively located at opposite sides of a pixel area A. The first column spacing S1 is disposed to be close to the first sub-pixel 11, and the second column spacing S2 is disposed to be close to the second sub-pixel 12.

The scan lines connected to sub-pixels in each pixel area A are arranged in the column spacing S1 and/or S2.

In an embodiment, as shown in FIG. 7, the scan line G1 connected to the first sub-pixel 11 and the third sub-pixel 13 is located in the first column spacing S1, and the scan line G2 connected to the second sub-pixel 12 and the fourth sub-pixel 14 is also located in the first column spacing S1, that is, the scan line G1 and the scan line G2 are both located in the column spacing located on a left side of the pixel area A where the sub-pixels are located. In one embodiment, the scan line G1 connected to the first sub-pixel 11 and the third sub-pixel 13 is located in the second column spacing S2, and the scan line G2 connected to the second sub-pixel 12 and the fourth sub-pixel 14 is also located in the second column spacing S2, that is, the scan line G1 and the scan line G2 are both located in the column spacing located on a right side of the pixel area A where the sub-pixels are located.

In this embodiment of the present disclosure, the scan lines of the sub-pixels in a same pixel area A are located in the column spacing S1 or in the column spacing S2. In this way, the scan line does not overlap with the transparent area A2, and thus it will not affect the transparency or light transmittance of the transparent area A2.

Figure 8:
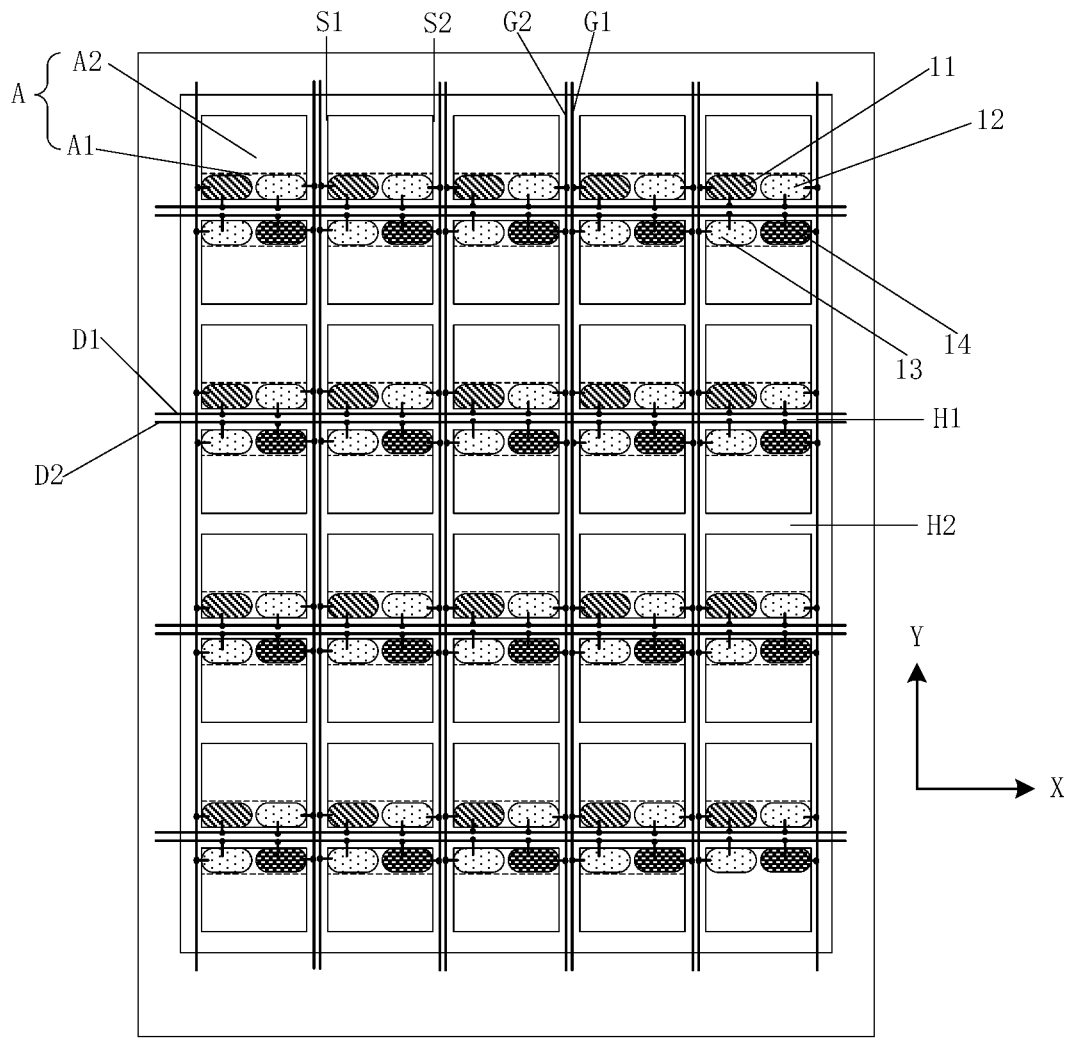
FIG. 8 is a schematic top view of a structure of yet another display panel according to an embodiment of the present disclosure.

FIG. 8 is a schematic top view of a structure of yet another display panel according to an embodiment of the present disclosure. In an embodiment, as shown in FIG. 8, the scan line G1 connected to the first sub-pixel 11 and the third sub-pixel 13 is located in the first column spacing S1 (i.e., the spacing located on a left side of the pixel area A in which the first sub-pixel 11 and the third sub-pixel 13 are arranged); and the scan line G2 connected to the second sub-pixel 12 and the fourth sub-pixel 14 is located in the second column spacing S2 (i.e., the gap located on a right side of the pixel area A in which the second sub-pixel 12 and the fourth sub-pixel 14 are arranged). In this way, a distance between a scan line and a sub-pixel connected to the scan line can be reduced, which further facilitates the application.

It can be seen that the display panel shown in FIG. 4 and FIG. 6 can be driven by row-by-row scanning, and the display panel shown in FIG. 7 and FIG. 8 can be driven by column-by-column scanning. In other words, the display panel provided by this embodiment of the present disclosure can be driven not only by row-by-row scanning but also by column-by-column scanning, thereby expanding an application range of the display panel and further facilitating application of the display panel.

An embodiment of the present disclosure further provides a driving method, which is applicable to the display panel provided by any one of the above embodiments. The display panel has at least two driving modes, that is, the display panel includes at least a first driving mode and a second driving mode. In the first driving mode, one frame of scan time includes a first scan period and a second scan period, that is, one frame of scan time is divided into two scan periods.

Figure 9:
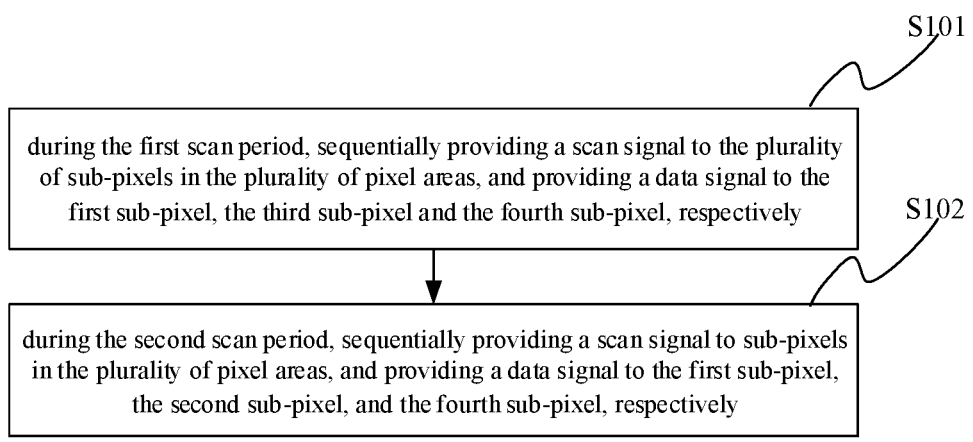
FIG. 9 is a flowchart of a driving method according to an embodiment of the present disclosure.

Based on this, as shown in FIG. 9, which is a flowchart of a driving method according to an embodiment of the present disclosure, in the first driving mode, the driving method includes the following steps.

At S101, during the first scan period, a scan signal is sequentially provided to sub-pixels in the pixel area, and a data signal is provided to the first sub-pixel, the third sub-pixel, and the fourth sub-pixel, respectively.

At S102, during the second scan period, a scan signal is sequentially provide to the sub-pixels in the pixel area, and a data signal is provided to the first sub-pixel, the second sub-pixel, and the fourth sub-pixel, respectively.

In an embodiment, as shown in FIG. 4 and FIG. 6, during the first scan period, a scan signal is row-by-row provided to all sub-pixels in the pixel areas A through the scan lines. In one embodiment, in a case where the display panel includes N rows of pixel areas A, during the first scan period, a scan signal may be row-by-row provided to all of the sub-pixels in the pixel areas A in a $1^{st}$ row to an $N^{th}$ row of the array through the scan lines. Moreover, a data signal is provided to the data lines D1 when the scan signal is provided to the sub-pixels in the pixel areas A in an odd-numbered row of the array through the scan lines, so that the data signal is provided to the first sub-pixels 11 through the data lines D1; and a data signal is provided to the data lines D1 and the data lines D2 when a scan signal is provided to the sub-pixels in the pixel areas A in an even-numbered row of the array through the scan lines, so that the data signal provided to the third sub-pixels 13 through the data lines D1 and to the fourth sub-pixels 14 through the data lines D2.

During the second scan period, a scan signal is row-by-row provided to all of the sub-pixels in the pixel areas A through the scan lines. In one embodiment, in a case where the display panel includes N rows of pixel areas A, during the first scan period, a scan signal may be row-by-row provided to all of the sub-pixels in the pixel areas A in a $1^{st}$ row to an $N^{th}$ row of the array through the scan lines. Moreover, a data signal is provided to the data lines D1 and data lines D2 when a scan signal is provided to the sub-pixels in the pixel areas A in an odd-numbered row through the scan lines, so that the data signal is provided to the first sub-pixels 11 through the data lines D1 and to the second sub-pixels 12 through the data lines D2; and a data signal is provided to the data lines D2 when a scan signal is provided to the sub-pixels in the pixel areas A in an even-numbered row of the array through the scan lines, so that the data signal is provided to the fourth sub-pixels 14 through the data lines D2.

The first sub-pixel 11, the third sub-pixel 13, and the fourth sub-pixel 14 are sub-pixels emitting different colors from one another, and the first sub-pixel 11, the second sub-pixel 12, and the fourth sub-pixel 14 are sub-pixels emitting different colors from one another, such as a red sub-pixel, a green sub-pixel and a blue sub-pixel. Thus, the display panel can display images respectively during the first scan period and during the second scan period, and an image having a high resolution can be formed after the images displayed during the two periods are superimposed. In this way, the transparency or light transmittance of the display panel can be increased, and the resolution of the display panel can be increased.

Figure 10:
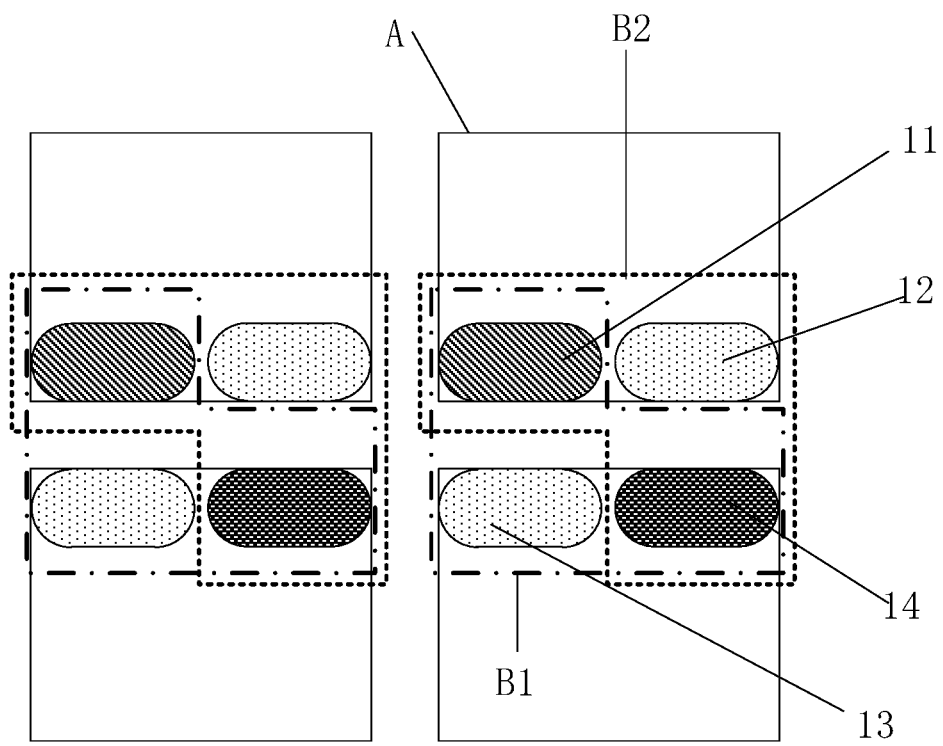
FIG. 10 is a schematic diagram illustrating a display mode of a display panel according to an embodiment of the present disclosure.

It should be noted that since one frame of scan time includes the first scan period and the second scan period, when performing time-division driving, it is possible to allow scan time for one frame image to be in accordance with the discipline of the human eye viewing an image by increasing a frequency of refreshing images. Further, FIG. 10 is a schematic diagram illustrating a display mode of a display panel according to an embodiment of the present disclosure. As shown in FIG. 10, during one scan period, i.e., during the first scan period, a first sub-pixel 11, a third sub-pixel 13 and a fourth sub-pixel 14 that are adjacent to each other together form a first pixel B1. During the other scan period, i.e., during the second scan period, a first sub-pixel 11, a second sub-pixel 12 and a fourth sub-pixel 14 that are adjacent to each other together form a second pixel B2.

It should be noted that after original data is obtained in this embodiment of the present disclosure, the original data may be converted depending on different resolutions, and display data (i.e., a data signal) of all first pixels B1 during the first scan period and display data (i.e., a data signal) of all second pixels B2 during the second scan period are obtained. During the first scan period, each first pixel B1 performs displaying according to the data signal. During the second scan period, each second pixel B2 performs displaying according to the data signal. In other words, the image displayed during the first scan period is formed by first pixels B1, and the image displayed during the second scan period is formed by second pixels B2. With pixel rendering, after the image displayed during the first scan period and the image displayed during the second scan period are superimposed, the first pixel B1 and the second pixel B2 may serve as two adjacent pixels in the superimposed image, so that the image having a first resolution displayed during the first scan period and the image having the first resolution displayed during the second scan period are superimposed to form an image having a second resolution. Herein, the second resolution is higher than the first resolution.

In an embodiment, the third sub-pixel 13 and the fourth sub-pixel 14 that form the first pixel B1 are located in different pixel areas A, and the first sub-pixel 11 and the second sub-pixel 12 that form the second pixel B2 are located in a same pixel area A; or, the third sub-pixel 13 and the fourth sub-pixel 14 that form the first pixel B1 are located in a same pixel area A, and the first sub-pixel 11 and the second sub-pixel 12 that form the second pixel B2 are located in different pixel areas A.

Figure 11:
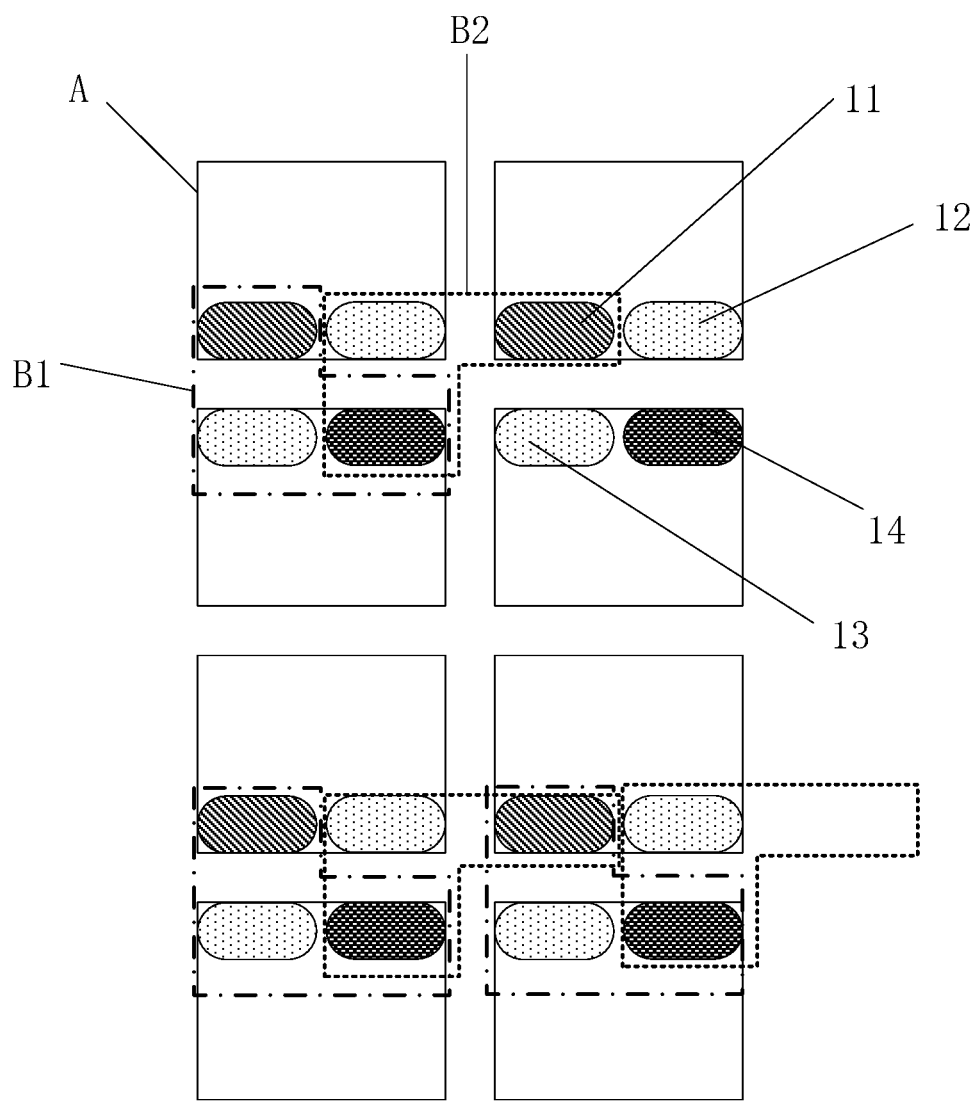
FIG. 11 is a schematic diagram illustrating another display mode of a display panel according to an embodiment of the present disclosure.

FIG. 11 is a schematic diagram illustrating another display mode of a display panel according to an embodiment of the present disclosure. Herein, FIG. 11 shows one of the two situations described above, that is, FIG. 11 shows a situation in which the third sub-pixel 13 and the fourth sub-pixel 14 that form the first pixel B1 are located in a same pixel area A, and the first sub-pixel 11 and the second sub-pixel 12 that form the second pixel B2 are located in different pixel areas A. In one embodiment, the first sub-pixel 11 forming the second pixel B2 is the first sub-pixel 11 in the second column of pixel areas A, and the second sub-pixel 12 forming the second pixel B2 is the second sub-pixel 12 in the first column of pixel areas A. The first pixel B1 and the second pixel B2 share one sub-pixel, i.e., the fourth sub-pixel 14. In order to facilitate distinguishing the first pixel B1 from the second pixel B2, the first pixel B1 and the second pixel B2 may not be completely overlapped in the row direction X, so that the human eye can spatially distinguish the first pixel B1 from the second pixel B2. In this way, the resolution of the display panel in the row direction X can be further improved, thereby improving the overall resolution of the display panel.

Similarly, in a case where the third sub-pixel 13 and the fourth sub-pixel 14 that form the first pixel B1 are located in different pixel areas A, and the first sub-pixel 11 and the second sub-pixel 12 that form the second pixel B2 are located in a same pixel area A, it is also possible that the first pixel B1 is formed by one fourth sub-pixel 14 in a column of pixel areas A and one third sub-pixel 13 in a next column of pixel areas A.

In an embodiment of the present disclosure, the first pixel B1 and the second pixel B2 that are adjacent to each other share at least one sub-pixel, and the at least one sub-pixel is provided with a same data signal during the first scan period and during the second scan period. In one embodiment, in the embodiment shown in FIG. 10, the first pixel B1 and the second pixel B2 that are adjacent to each other share the first sub-pixel 11 and the fourth sub-pixel 14. The first sub-pixel 11 is provided with a same data signal during the first scan period and during the second scan period, and the fourth sub-pixel 14 is provided with a same data signal during the first scan period and during the second scan period. In this way, a voltage fluctuation of the sub-pixel during different scan periods can be reduced, thereby saving the power consumption.

It is assumed that after the original data is converted, a grayscale of 20 corresponding to the first sub-pixel 11 during the first scan period and a grayscale of 30 corresponding to the first sub-pixel 11 during the second scan period are obtained, and then the data signal can be further converted, so that the grayscale corresponding to the first sub-pixel 11 during the first scan period is 25 and the grayscale corresponding to the first sub-pixel 11 during the second scan period is 25. In this case, a voltage fluctuation of the first sub-pixel 11 can be reduced, thereby saving the power consumption. In other words, the sub-pixel shared by the first pixel B1 and the second pixel B2 is provided with a same data signal during the first scan period and during the second scan period, so that voltage fluctuation of the shared sub-pixel can be reduced, thereby saving the power consumption.

Similarly, in the embodiment shown FIG. 11, the first pixel B1 and the second pixel B2 that are adjacent to each other share the fourth sub-pixel 14. The fourth sub-pixel 14 is provided with a same data signal during the first scan period and during the second scan period.

It should be noted that the present disclosure is not limited thereto. In other embodiments, the first pixel B1 and the second pixel B2 share at least one sub-pixel. The at least one sub-pixel each is provided with a first data signal during the first scan period, and the at least one sub-pixel each is provided with a second data signal during the second scan period. The first data signal is an original data signal corresponding to the first pixel, and the second data signal is an original data signal corresponding to the second pixel. In this way, calculation for grayscales can be omitted.

In one embodiment, in the embodiment shown in FIG. 10, the first pixel B1 and the second pixel B2 that are adjacent to each other share the first sub-pixel 11 and the fourth sub-pixel 14. It is assumed that in the original data, a grayscale of the first sub-pixel 11 corresponding to the first pixel B1 is 20, and a grayscale of the first sub-pixel 11 corresponding to the second pixel B2 is 30. In this case, a grayscale of the first sub-pixel 11 during the first scan period is 20, and a grayscale of the first sub-pixel 11 during the second scan period is 30. In this way, calculation for grayscales can be omitted. In other words, the original data signal is not processed, so that the calculation for grayscales can be omitted.

Furthermore, in the second driving mode, the driving method of the display panel provided by this embodiment of the present disclosure further includes the following steps.

During one frame of scan time, a scan signal is sequentially provided to the sub-pixels in the pixel area, and a data signal is provided to at least three sub-pixels emitting light of different colors among the first sub-pixel 11 to the fourth sub-pixel 14.

In an embodiment, a data signal may be provided to the first sub-pixel 11, the second sub-pixel 12, and the fourth sub-pixel 14 during one frame of scan time so as to drive the first sub-pixel 11, the second sub-pixel 12, and the fourth sub-pixel 14 to perform displaying; or, a data signal may be provided to the first sub-pixel 11, the third sub-pixel 13, and the fourth sub-pixel 14 during one frame of scan time so as to drive the first sub-pixel 11, the third sub-pixel 13, and the fourth sub-pixel The pixel 14 to perform displaying; or a data signal is provided to the first sub-pixel 11, the second sub-pixel 12, the third sub-pixel 13, and the fourth sub-pixel 14 during one frame of scan time so as to drive the first sub-pixel 11, the second sub-pixel 12, the third sub-pixel 13, and the fourth sub-pixel 14 to perform displaying.

Figure 12:
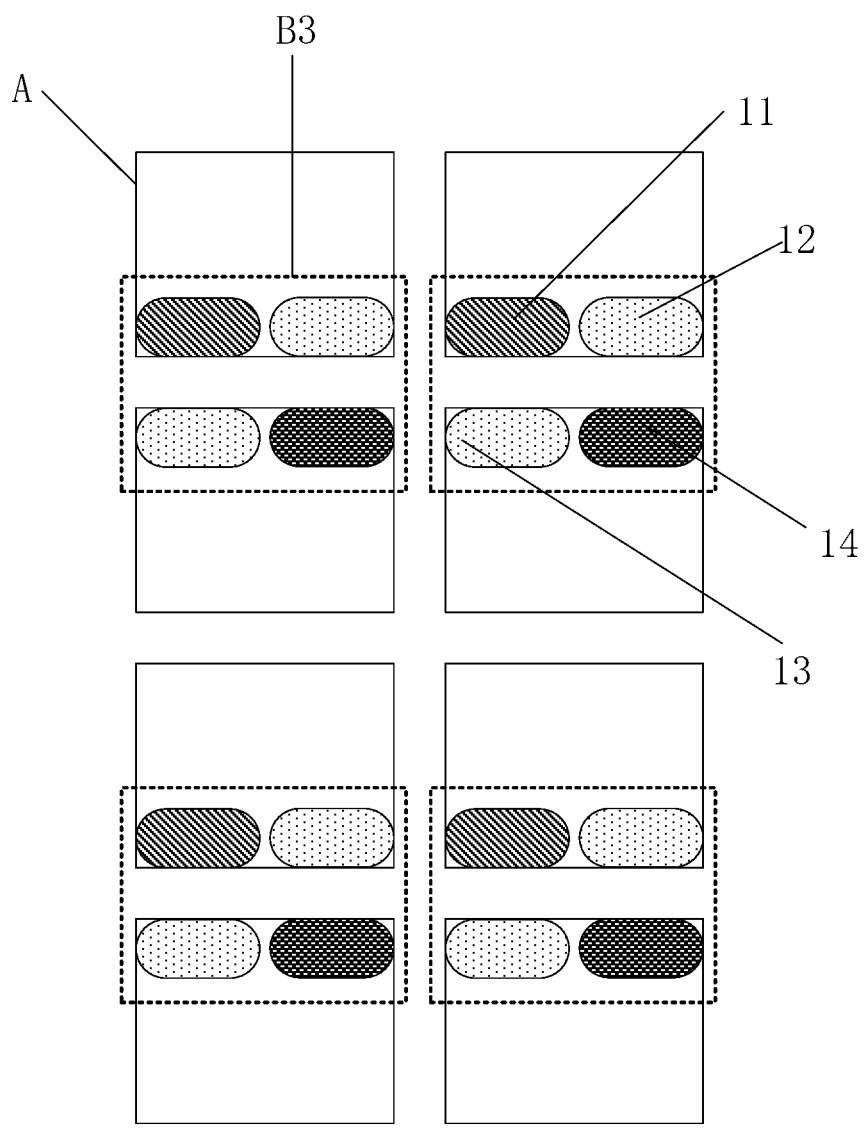
FIG. 12 is a schematic diagram illustrating still another display mode of a display panel according to an embodiment of the present disclosure.

In this embodiment of the present disclosure, the time-division driving method is not used in the second driving mode. Although the resolution is reduced compared with the time-division driving method, the driving method is simpler and more practical. FIG. 12 is a schematic diagram illustrating still another display mode of a display panel according to an embodiment of the present disclosure. As shown in FIG. 12, in the second driving mode, when a data signal is provided to all of the first sub-pixel 11 to the fourth sub-pixel 14, the first sub-pixel 11, the second sub-pixel 12, the third sub-pixel 13, and the fourth sub-pixel 14 that are adjacent to one another together form a third pixel B3. In one embodiment, the first sub-pixel 11 and the second sub-pixel 12 in the pixel area A located in the first row and the first column, and the third sub-pixel 13 and the fourth sub-pixel 14 in the pixel area A located in the second row and the first column together form the third pixel B3.

Based on this, each of two sub-pixels emitting light of a same color can have a reduced brightness during each scan period by controlling the two sub-pixels to simultaneously emit light. In this way, a driving voltage or a driving current of the sub-pixel emitting light of this color can be reduced, thereby reducing the power consumption of the display panel. Moreover, controlling four adjacent sub-pixels to emit light, i.e., controlling the first sub-pixel 11 to the fourth sub-pixel 14 to perform displaying, is more advantageous for mixing light in a case where the first sub-pixel 11 to the fourth sub-pixel 14 have a small spacing therebetween.

It should be noted that in order to reduce the power consumption, only a part of sub-pixels may be driven to perform displaying in the second driving mode. In one embodiment, the first sub-pixel 11, the second sub-pixel 12 and the fourth sub-pixel 14 are driven to perform displaying, and the first sub-pixel 11, third sub-pixel 13 and fourth sub-pixel 14 to perform displaying. In this case, since a part of sub-pixels does not perform displaying, a sub-pixel that does not perform displaying may be interposed between two adjacent pixels. As a result, adjacent pixels have a more pronounced division therebetween. This can achieve a better color mixing among sub-pixels forming the pixel, thereby allowing the image to be displayed more clearly.

It should be noted that in this embodiment of the present disclosure, a driving mode of the display panel may be set as the first driving mode or the second driving mode depending a resolution requirement. When a high resolution is required, the first driving mode may be selected as the driving mode of the display panel. When a low resolution is required, the second driving mode may be selected as the driving mode of the display panel. It should be noted that the present disclosure is not limited thereto. In other embodiments, the driving mode of the display panel may be set as only the first driving mode so as to meet the user's high resolution requirement.

Figure 13:
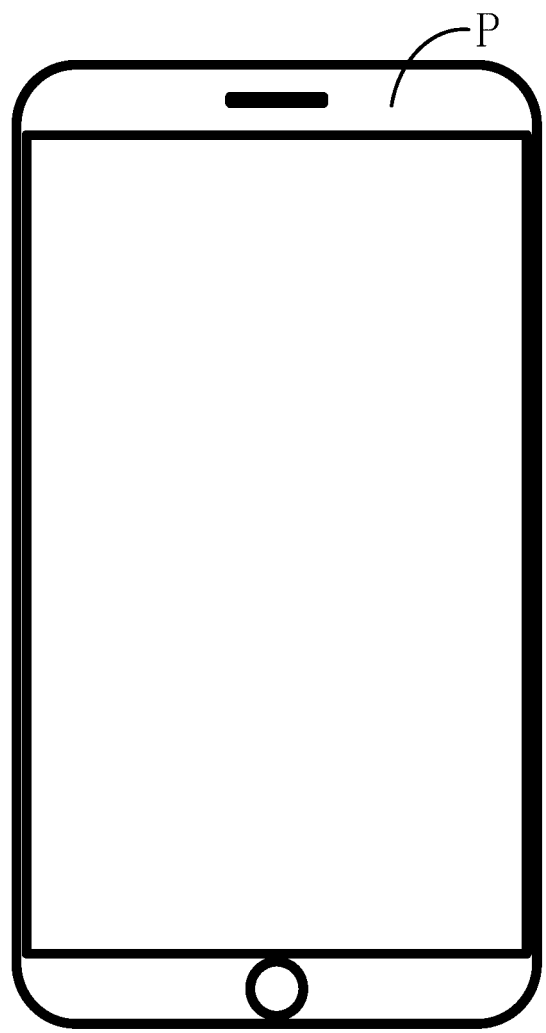
FIG. 13 is a schematic diagram of a structure of a display device according to an embodiment of the present disclosure.

An embodiment of the present disclosure further provides a display device. FIG. 13 is a schematic diagram of a structure of a display device according to an embodiment of the present disclosure. As shown in FIG. 13, the display device P includes the display panel provided by any of the above embodiments. The display device P is a transparent display device, and the display device P includes but is not limited to a cellphone, a tablet computer, a digital camera, or the like.

It should be noted that the various embodiments in the present specification are described in a progressive manner, and each embodiment focuses on differences from other embodiments, and the same and similar parts between the various embodiments can be referred to each other. For the device disclosed in each embodiment, since it corresponds to the method disclosed in the embodiment, the description thereof is simple and the relevant part can be referred to the method.

What is claimed is:

1. A display panel, comprising:
a plurality of pixel areas arranged in an array and a plurality of sub-pixels located in the plurality of pixel areas,
wherein each of the plurality of pixel areas comprises a sub-pixel area and a transparent area that are arranged in a column direction; for two adjacent rows of pixel areas of the plurality of pixel areas, sub-pixel areas of pixel areas in one row of pixel areas are disposed adjacent to sub-pixel areas of pixel areas in the other row of pixel areas, or transparent areas of pixel areas in one row of pixel areas are disposed adjacent to transparent areas of pixel areas in the other row of pixel areas;
the plurality of sub-pixels comprises a first sub-pixel, a second sub-pixel, a third sub-pixel and a fourth sub-pixel;
the sub-pixel area of each pixel area in an odd-numbered row of pixel areas of the plurality of pixel areas is a first sub-pixel area, and the first sub-pixel and the second sub-pixel are arranged in the first sub-pixel area along a row direction; the sub-pixel area of each pixel area in an even-numbered row of pixel areas of the plurality of pixel areas is a second sub-pixel area, and the third sub-pixel and the fourth sub-pixel are arranged in the second sub-pixel area along the row direction; the first sub-pixel and the third sub-pixel are arranged along the column direction, and the second sub-pixel and the fourth sub-pixel are arranged along the column direction; and
the first sub-pixel, the second sub-pixel, and the fourth sub-pixel emit light of different colors, and the second sub-pixel and the third sub-pixel emit light of a same color.

2. The display panel according to claim 1, wherein each of the plurality of sub-pixels has a length in the row direction and a length in the column direction, the length in the row direction being greater than the length in the column direction.

3. The display panel according to claim 1, wherein the first sub-pixel emits red light, the second sub-pixel and the third sub-pixel emit green light, and the fourth sub-pixel emit blue light.

4. The display panel according to claim 1, wherein column spacings extending in the column direction are formed among the plurality of pixel areas arranged in the array, and
data lines connected to the plurality of sub-pixels in the plurality of pixel areas are located in the column spacings.

5. The display panel according to claim 4, wherein the column spacings comprise a first column spacing and a second column spacing that are respectively located at opposite sides of a pixel area of the plurality of pixel areas, the first column spacing is disposed to be close to the first sub-pixel in the pixel area, and the second column spacing is disposed to be close to the second sub-pixel in the pixel area, and
  one of the data lines connected to the first sub-pixel is located in the first column spacing, and one of the data lines connected to the second sub-pixel is arranged in the second column spacing.

6. The display panel according to claim 5, wherein one of the data lines connected to the third sub-pixel is located in the first column spacing, and one of the data lines connected to the fourth sub-pixel is located in the second column spacing.

7. The display panel according to claim 1, wherein row spacings extending in the row direction are formed among the plurality of pixel areas arranged in the array, each of the row spacings is arranged between two adjacent rows of pixel areas of the plurality of pixel areas, and the row spacings comprise a first row spacing and a second row spacing, the first row spacing is adjacent to sub-pixel areas of two rows of pixel areas adjacent thereto, and the second row spacing is adjacent to transparent areas of two rows of pixel areas adjacent thereto, and
  scan lines connected to the plurality of sub-pixels of the plurality of pixel areas are located in the first row spacing.

8. The display panel according to claim 7, wherein the scan lines comprise a first scan line and a second scan line,
  the first scan line is connected to the plurality of sub-pixels in each sub-pixel area located on one side of the first row spacing, and
  the second scan line is connected to the plurality of sub-pixels in each sub-pixel area located on the other side of the first row spacing.

9. The display panel according to claim 1, wherein row spacings extending in the row direction are formed among the plurality of pixel areas arranged in the array, each of the row spacings is arranged between two adjacent rows of pixel areas of the plurality of pixel areas, and the row spacings comprise a first row spacing and a second row spacing; the first row spacing is adjacent to sub-pixel areas of two rows of pixel areas adjacent thereto, and the second row spacing is adjacent to transparent areas of two rows of pixel areas adjacent thereto, and
  data lines connected to the plurality of sub-pixels in the plurality of pixel areas are located in the first row spacing.

10. The display panel according to claim 9, wherein a column spacing extending in the column direction is formed between two adjacent columns of pixel areas of the plurality of pixel areas arranged in the array, and
  a scan line connected to the plurality of sub-pixels in the two adjacent columns of pixel areas are located in the column spacing.

11. The display panel according to claim 1, wherein each of the plurality of sub-pixels comprises a micro light-emitting diode.

12. A driving method, applied to the display panel according to claim 1,
  wherein the display panel comprises at least a first driving mode, and each frame of scan time in the first driving mode comprises a first scan period and a second scan period, and the driving method comprises:
  during the first scan period, sequentially providing a scan signal to the plurality of sub-pixels in the plurality of pixel areas, and providing a data signal to the first sub-pixel, the third sub-pixel and the fourth sub-pixel, respectively; and
  during the second scan period, sequentially providing a scan signal to sub-pixels in the plurality of pixel areas, and providing a data signal to the first sub-pixel, the second sub-pixel, and the fourth sub-pixel, respectively.

13. The driving method according to claim 12, wherein the display panel further comprises a second driving mode, and the driving method further comprises:
  in the second driving mode, during each frame of scan time, sequentially providing a scan signal to sub-pixels in the plurality of pixel areas, and providing a data signal to at least three sub-pixels emitting light of different colors among the first to fourth sub-pixels.

14. The driving method according to claim 13, wherein in the second driving mode, a data signal is provided to all of the first to fourth sub-pixels;
  one first sub-pixel, one second sub-pixel, one third sub-pixel, and one fourth sub-pixel that are adjacent to one another together form one third pixel.

15. The driving method according to claim 12, wherein during the first scan period, one first sub-pixel, one third sub-pixel, and one fourth sub-pixel that are adjacent to one another together form one first pixel;
  during the second scan period, one first sub-pixel, one second sub-pixel, and one fourth sub-pixel that are adjacent to one another together form one second pixel.

16. The driving method according to claim 15, wherein the third sub-pixel and the fourth sub-pixel of the first pixel are located in different pixel areas of the plurality of the pixel areas, and the first sub-pixel and the second sub-pixel of the second pixel are located in a same pixel area of the plurality of pixel areas; or
  the third sub-pixel and the fourth sub-pixel of the first pixel are located in a same pixel area of the plurality of pixel areas, and the first sub-pixel and the second sub-pixel of the second pixel are located in different pixel areas of the plurality of pixel areas.

17. The driving method according to claim 15, wherein the first pixel and the second pixel that are adjacent to each other share at least one sub-pixel, and the at least one sub-pixel shared by the first pixel and the second pixel is provided with a same data signal during the first scan period and during the second scan period.

18. The driving method according to claim 15, wherein the first pixel and the second pixel that are adjacent to each other share at least one sub-pixel, the at least one sub-pixel shared by the first pixel and the second pixel is provided with a first data signal during the first scan period, and the at least one sub-pixel shared by the first pixel and the second pixel is provided with a second data signal during the second scan period, wherein the first data signal is an original data signal corresponding to the first pixel, and the second data signal is an original data signal corresponding to the second pixel.

19. A display device, comprising a display panel, the display panel comprising a plurality of pixel areas arranged in an array and a plurality of sub-pixels located in the plurality of pixel areas,
  wherein each of the plurality of pixel areas comprises a sub-pixel area and a transparent area that are arranged in a column direction; for two adjacent rows of pixel areas of the plurality of pixel areas, sub-pixel areas of pixel areas in one row of pixel areas are disposed adjacent to sub-pixel areas of pixel areas in the other row of pixel areas, or transparent areas of pixel areas in one row of pixel areas are disposed adjacent to transparent areas of pixel areas in the other row of pixel areas;

the plurality of sub-pixels comprises a first sub-pixel, a second sub-pixel, a third sub-pixel and a fourth sub-pixel;

the sub-pixel area of each pixel area in an odd-numbered row of pixel areas of the plurality of pixel areas is a first sub-pixel area, and the first sub-pixel and the second sub-pixel are arranged in the first sub-pixel area along a row direction; the sub-pixel area of each pixel area in an even-numbered row of pixel areas of the plurality of pixel areas is a second sub-pixel area, and the third sub-pixel and the fourth sub-pixel are arranged in the second sub-pixel area along the row direction; the first sub-pixel and the third sub-pixel are arranged along the column direction, and the second sub-pixel and the fourth sub-pixel are arranged along the column direction; and the first sub-pixel, the second sub-pixel, and the fourth sub-pixel emit light of different colors, and the second sub-pixel and the third sub-pixel emit light of a same color.

* * * * *